US011837860B2

(12) United States Patent
Tsorng et al.

(10) Patent No.: US 11,837,860 B2
(45) Date of Patent: Dec. 5, 2023

(54) CABLE-GLAND SYSTEM FOR AN ELECTRONIC CHASSIS PROVIDING ENHANCED SEALING FUNCTIONALITY

(71) Applicant: Quanta Computer Inc., Taoyuan (TW)

(72) Inventors: Yaw-Tzorng Tsorng, Taoyuan (TW); Ming-Lung Wang, Taoyuan (TW); Yuan-Chi Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 326 days.

(21) Appl. No.: 17/248,522

(22) Filed: Jan. 28, 2021

(65) Prior Publication Data

US 2022/0131357 A1 Apr. 28, 2022

Related U.S. Application Data

(60) Provisional application No. 63/104,240, filed on Oct. 22, 2020.

(51) Int. Cl.
*H02G 3/22* (2006.01)
*H01B 17/30* (2006.01)
(Continued)

(52) U.S. Cl.
CPC ............. *H02G 3/22* (2013.01); *H01B 17/265* (2013.01); *H01B 17/303* (2013.01); *H01B 17/66* (2013.01); *H02G 1/06* (2013.01); *H05K 7/02* (2013.01)

(58) Field of Classification Search
None
See application file for complete search history.

(56) References Cited

U.S. PATENT DOCUMENTS 4,341,922 A * 7/1982 Bossard ............... H02G 15/013
174/92
4,589,794 A * 5/1986 Sugiura ................. H05K 7/142
24/336
(Continued)

FOREIGN PATENT DOCUMENTS

DE 3817795 A1 * 12/1989
DE 4211071 C1 * 9/1993 ......... B60R 16/0222
(Continued)

OTHER PUBLICATIONS

EP3012933. Glomb (Year: 2016).*

*Primary Examiner* — Timothy J. Dole
*Assistant Examiner* — Muhammed Azam
(74) *Attorney, Agent, or Firm* — NIXON PEABODY LLP (57) ABSTRACT

A cable-gland system provides a sealing function to openings in an electronic chassis that receive cables. The cable-gland system comprises a plurality of individual cable glands. Each of the plurality of individual cable glands includes an exterior end to be positioned adjacent an exterior of the chassis, and an interior end for positioning within the chassis. Each of the plurality of individual cable glands includes a through-hole extending between the exterior and interior ends for receiving one of the cables, and an outer surface between the exterior and interior ends. Each of the plurality of individual cable glands has a male projection on one side of the outer surface and a female recess on an opposing side of the outer surface. The cable glands are connectable to form the cable-gland system by mating the male projection on one cable gland with the female recess of an adjacent cable gland.

9 Claims, 6 Drawing Sheets

(51) Int. Cl.
*H02G 1/06* (2006.01)
*H01B 17/66* (2006.01)
*H05K 7/02* (2006.01)
*H01B 17/26* (2006.01)

(56) References Cited

U.S. PATENT DOCUMENTS

| | | | | |
|---|---|---|---|---|
| 4,709,124 A * | 11/1987 | Wheeler | H02G 15/013 | 310/71 |
| 4,724,278 A * | 2/1988 | Smith | H02G 3/22 | 277/609 |
| 4,733,016 A * | 3/1988 | Twist | H02G 3/22 | 361/827 |
| 4,733,019 A * | 3/1988 | Pichler | H02G 15/013 | 174/92 |
| 5,006,920 A * | 4/1991 | Schafer | H05K 7/02 | 257/713 |
| 5,416,271 A * | 5/1995 | Birmingham | H02G 3/22 | 174/657 |
| 5,610,368 A * | 3/1997 | Smith | H02G 3/22 | 333/182 |
| 5,883,333 A * | 3/1999 | Wambeke | H02G 15/013 | 174/92 |
| 6,184,472 B1 * | 2/2001 | Dams | H02G 15/007 | 174/93 |
| 7,281,958 B2 * | 10/2007 | Schuttler | H01R 9/223 | 439/660 |
| 7,781,914 B2 * | 8/2010 | Kotlyar | H02J 9/062 | 307/56 |
| 9,692,193 B1 * | 6/2017 | Schnorr | H02G 3/22 | |
| 10,544,884 B2 * | 1/2020 | Beele | F16L 5/10 | |
| 10,700,502 B2 * | 6/2020 | Mechler | H02G 3/22 | |
| 2004/0238201 A1 * | 12/2004 | Asakura | H02G 15/013 | 174/92 |
| 2007/0023198 A1 * | 2/2007 | Van Noten | H02G 3/083 | 174/93 |
| 2010/0059941 A1 * | 3/2010 | Beele | F16L 5/10 | 277/606 |
| 2015/0053476 A1 * | 2/2015 | Smith | H02G 3/22 | 174/660 |
| 2016/0020592 A1 * | 1/2016 | Beele | F16L 3/227 | 248/56 |
| 2017/0179702 A1 * | 6/2017 | Persson | H02G 15/013 | |
| 2022/0131357 A1 * | 4/2022 | Tsorng | H02G 1/06 | |
| 2022/0224097 A1 * | 7/2022 | Tsorng | H02G 3/22 | |
| 2022/0346259 A1 * | 10/2022 | Chang | F04D 19/002 | |

FOREIGN PATENT DOCUMENTS

| | | | | |
|---|---|---|---|---|
| DE | 202011108274 U1 * | 3/2012 | | E04G 15/061 |
| DE | 102011088487 A1 * | 6/2013 | | F16L 3/222 |
| DE | 202015102280 U1 * | 6/2016 | | H02G 1/06 |
| DE | 202019101892 U1 * | 8/2020 | | H02G 3/22 |
| EP | 2597501 A1 * | 5/2013 | | G02B 6/4444 |
| FR | 2977651 A1 * | 1/2013 | | H02G 3/22 |
| GB | 2204922 A * | 11/1988 | | F16L 5/08 |
| WO | WO-2005057749 A1 * | 6/2005 | | F16L 5/08 |
| WO | WO-2012032156 A2 * | 3/2012 | | H02G 3/08 |
| WO | WO-2016104242 A1 * | 6/2016 | | H01B 7/18 |

* cited by examiner

CABLE-GLAND SYSTEM FOR AN ELECTRONIC CHASSIS PROVIDING ENHANCED SEALING FUNCTIONALITY

RELATED APPLICATIONS

This application claims priority under 35 U.S.C. § 119 to U.S. Provisional Application No. 63/104,240, entitled "Cable Gland in Series Application on 5G Device for Waterproof," and filed on Oct. 22, 2020. The contents of that application are hereby incorporated by reference in their entirety.

FIELD OF THE INVENTION

The present invention relates generally to cable connection system for an electronic chassis and, more specifically, to a cable-gland system for a 5G electronic chassis that is easy to assemble and avoids environmental problems by its enhanced waterproof functionality.

BACKGROUND OF THE INVENTION

Cellular networks rely on various electronic devices, such as radios and antennas, that are mounted on support structures exposed to the environment. Some of those support structures are very tall, oftentimes at heights of 100 feet or more. As such, these electronic devices are exposed to inclement weather. Advancements in technology have led to 5G networks that require several interconnected devices having chasses that receive cables. Because of the need to permit cables to enter the chassis of the device, various methods have been utilized to help restrict water and debris from entering the chassis from the region around the cables.

Figure 1:
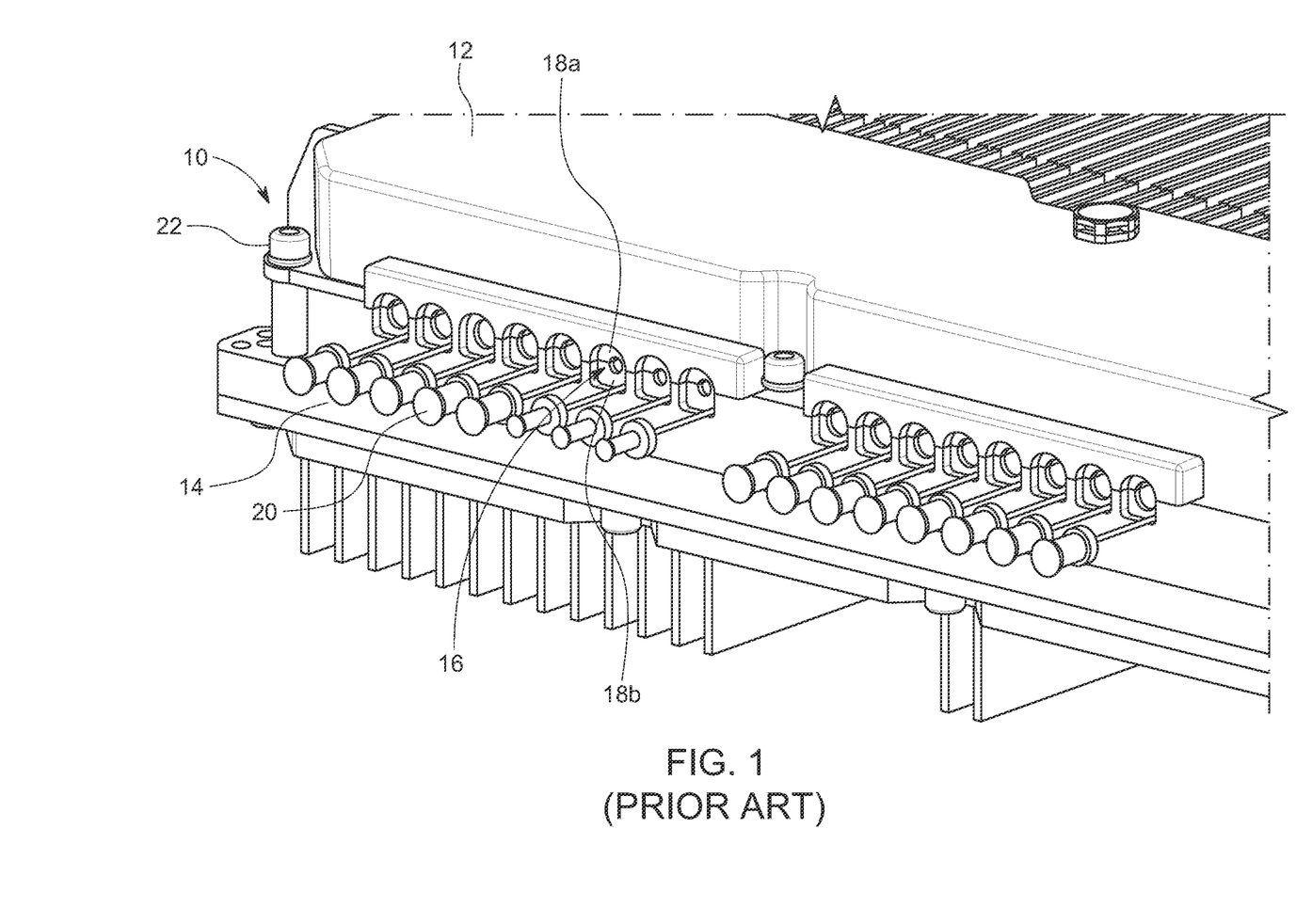
FIG. 1 is a perspective view of a prior art system for permitting cables to enter an electronic chassis.

One example of an existing system is illustrated in FIG. 1. A 5G electronic chassis 10 includes a top cover 12 and a base 14. At the interface between the top cover 12 and the base 14, there are pieces of rubber 18a, 18b that form openings 16 to provide access for cables and wiring (hereinafter "cables"). For any opening 16 that is not used for a cable, a plug 20 is inserted into the corresponding opening 16 to seal it. With the top cover 12 removed from the base 14, the cables are inserted into the openings 16. The top cover 12 is then placed over the base 14 and the screws 22 are tightened to force the top cover 12 and the base 14 together, which also forces the pieces of rubber 18a, 18b against the cables. However, in these existing systems, the types and sizes of the cables to be used within the electronic device may change over its life cycle. Further, it is difficult to have those cables match the openings 16 formed by the rubber pieces 18a, 18b. Finally, it is often difficult to control the small gaps around the rubber pieces 18a, 18b as pressure is applied by the screws 22.

Figure 2:
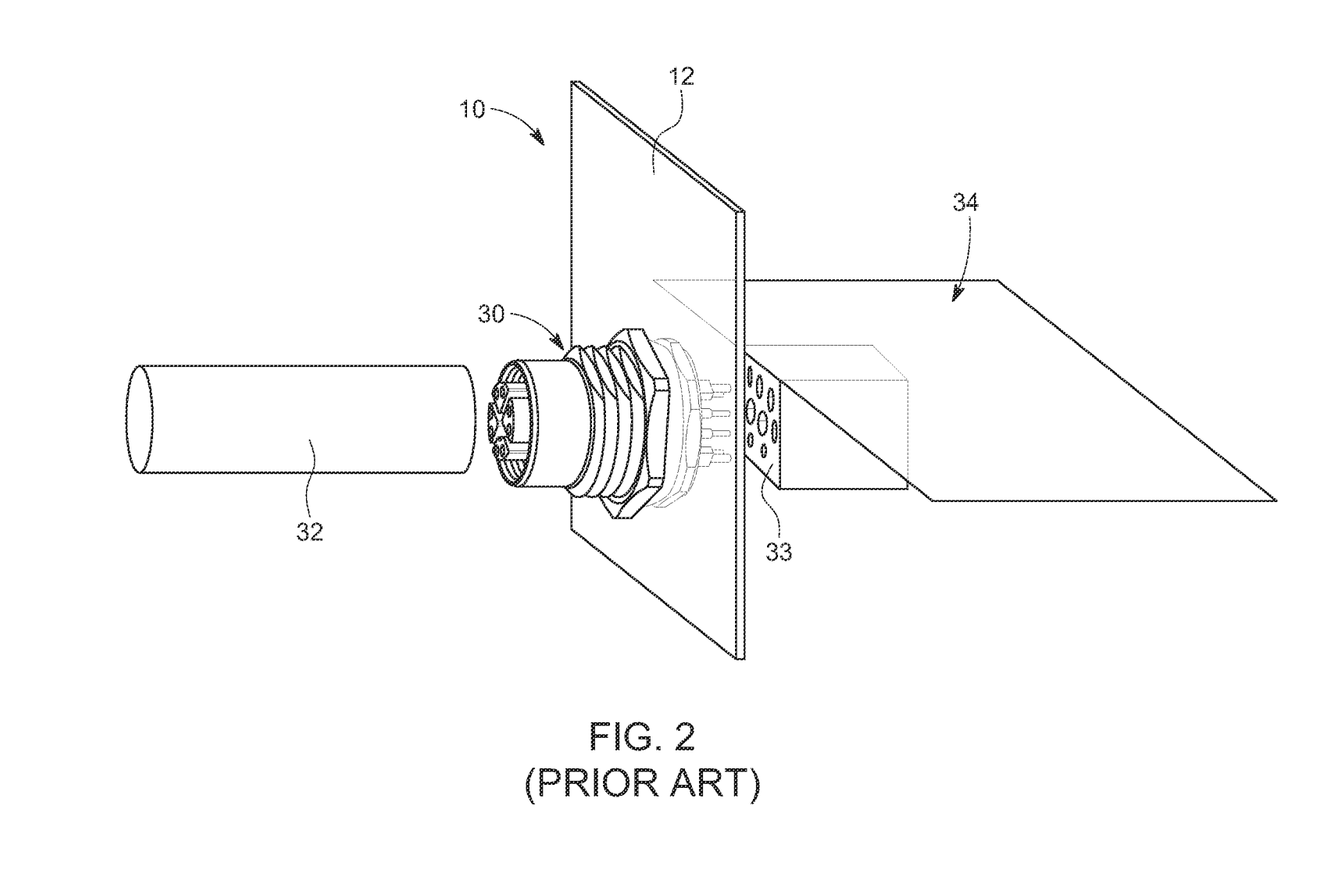
FIG. 2 is a perspective view of another prior art system for permitting cables to enter an electronic chassis.

FIG. 2 represents another existing system for permitting entry of cables into the electronic chassis 10. An electronic cable gland 30 is located on a wall of the electronic chassis 10, such as a wall on the top cover 12. On the exterior side of the electronic chassis 10, a cable 32 terminates at the electronic cable gland 30 and forms an electrical connection with the electronic cable gland 30. On the interior side of the electronic chassis 10, the electronic cable gland 30 includes pins that are interconnected with a connector 33 on a printed circuit board 34. The problem with the electronic cable gland 30 is that the printed circuit board 34 must be directly adjacent to the electronic cable gland 30, which restricts the location of the electrical components in the electronic chassis 10.

As such, a need exists for an improved cable-connection system that provide flexibility in the sizes of cables that enter the electronic chassis, a user-friendly way to permit connection of the cables to electrical components within the electronic chassis, and enhanced sealing functionality to protect the internal components from water and other debris.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a cable-gland system provides a sealing function to openings that receive cables in an electronic chassis. The cable-gland system comprises a plurality of individual cable glands. Each of the plurality of individual cable glands includes an exterior end to be positioned adjacent an exterior of the chassis, and an interior end for positioning within the chassis. Each of the plurality of individual cable glands includes a through-hole extending between the exterior and interior ends for receiving one of the cables, and an outer surface between the exterior and interior ends. Each of the plurality of individual cable glands has a male projection on one side of the outer surface and a female recess on an opposing side of the outer surface. The individual cable glands are connectable to form the cable-gland system by mating the male projection on one cable gland with the female recess of an adjacent cable gland.

According to a configuration of the above implementation, each of the plurality of individual cable glands has a registration feature for mating within a corresponding feature in the chassis.

According to another configuration of the above implementation, the registration feature is a projection extending away from the outer surface for mating within a corresponding recess in the chassis.

According to a further configuration of the above implementation, the through-holes in the individual cable glands have different internal diameters for receiving cables of different sizes.

In a further aspect of the above implementation, each of the plurality of individual cable glands includes a front annular groove adjacent to the exterior end. The annular groove receives a corresponding portion of the chassis.

In yet a further aspect of the above implementation, the exterior ends of the plurality of individual cable glands protrude outside of the chassis.

In another aspect of the above implementation, each of the plurality of individual cables further includes an O-ring adjacent to the interior end for assisting with sealing the cable gland within the chassis.

According to a further configuration of the above implementation, each of the plurality of individual cable glands is generally cylindrical. The male projection is located on a first platform extending away from the one side of the outer surface. The female recess is located on a second platform extending away from the opposing side of the outer surface.

According to another configuration of the above implementation, the male projections and the female recesses form a snap-fit connection.

In yet a further aspect of the above implementation, each of the plurality of individual cable glands is interchangeable within the connected cable-gland system such that locations of two individual cable glands within the cable-gland system can be exchanged.

Another aspect of the present disclosure includes an electronics device for a communications network that is intended for placement in an outside environment. The electronics device includes a chassis, a plurality of individual cable glands, and electronic components. The chassis has a base and a cover. The base engages the cover at an interface. At least one of the base and the cover have a plurality of cavities in a surface adjacent to the interface. The plurality of individual cable glands are connected to form a cable-gland system. Each of the plurality of individual cable glands includes an exterior end, an interior end, a through-hole extending between the exterior and interior ends, and an outer surface between the exterior and interior ends. The outer surfaces of the individual cable glands within the cable-gland system are received in the plurality of cavities. The electronic components are located within the chassis. The electronic components are coupled to cables. Each of the cables extends through a corresponding one of the through-holes of the cable glands to allow the cables to exit the chassis.

According to another configuration of the above implementation, each of the plurality of individual cable glands has a registration feature for mating within a corresponding feature in a respective one of the plurality of cavities.

According to another configuration of the above implementation, the registration features are projections and the corresponding features are recesses that extend inwardly into the plurality of cavities.

According to another aspect of the above implementation, each of the plurality of individual cable glands has a male projection on one side of the outer surface and a female recess on an opposing side of the outer surface. The male projection on one individual cable gland is connected with the female recess of an adjacent individual cable gland to form the cable-gland system.

According to a further aspect of the above implementation, each of the plurality of individual cable glands is generally cylindrical. The male projection is located on a first platform extending away from the one side of the outer surface. The female recess is located on a second platform extending away from the opposing side of the outer surface.

According to yet a further aspect of the above implementation, the male projections and the female recesses form a snap-fit connection. The individual cable glands are interchangeable within the cable-gland system such that locations of two individual cable glands within the cable-gland system can be exchanged.

A further aspect of the present disclosure includes a method of assembling an electronics device that is exposed to an outside environment. The electronics device has a chassis with an interface between a base of the chassis and a cover of the chassis. The electronics device includes electronic components located within the chassis that connect to a plurality of cables that exit the chassis. The method comprises inserting each of the plurality of cables through a corresponding cable gland and connecting each of the cable glands to form a cable-gland system. The method further comprises installing each of the cable glands into a corresponding cavity of the chassis at the interface of the base and the cover, and attaching the base to the cover.

According to one aspect of the above implementation, the act of installing each of the cable glands into the corresponding cavity of the chassis occurs after the cable glands have been connected to form a cable-gland system.

According to yet a further aspect of the above implementation, the plurality of cables include a smaller cable with a smaller outer diameter. Each of the cable glands has the same exterior profile. At least one of the cable glands has an internal though-hole with a smaller internal diameter for use with the smaller cable.

According to another aspect of the above implementation, the method further includes, after inserting each of the plurality of cables through the corresponding cable gland, electrically connecting the cables to the electronic components.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 3:
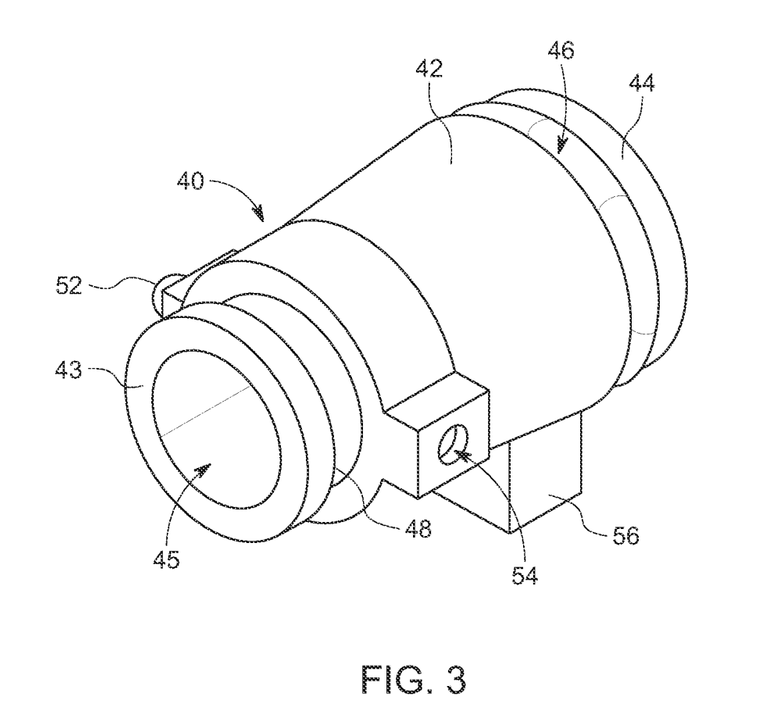
FIG. 3 is a perspective view of a cable gland according to one embodiment of the present disclosure.

FIG. 3 illustrates an individual cable gland 40, in accordance with one embodiment of the present invention. The cable gland 40 has an outer surface 42 that extends between an exterior end 43 and an interior end 44. The cable gland 40 includes a through-hole 45 that also extends between the exterior end 43 and the interior end 44. An O-ring 46 fits into a groove (not shown because part of the O-ring 46 fills the groove) in the outer surface 42 near the interior end 44. The outer surface 42 of the cable gland 40 also includes an annular groove 48 near the exterior end 43. Unlike the prior art electronic cable gland 30 of FIG. 2, the cable gland 40 is hollow to permit a cable to extend through the through-hole 45.

The cable gland 40 includes connecting mechanisms that allow individual cable glands 40 to be connected to each other, preferably in a snap-fit type of arrangement. As shown in FIG. 3, one side of the outer surface 42 of the cable gland 40 includes a male feature 52, and the opposing side includes a female feature 54. The male and female features 52, 54 are described in more detail below relative to FIGS. 4-5.

Figure 7:
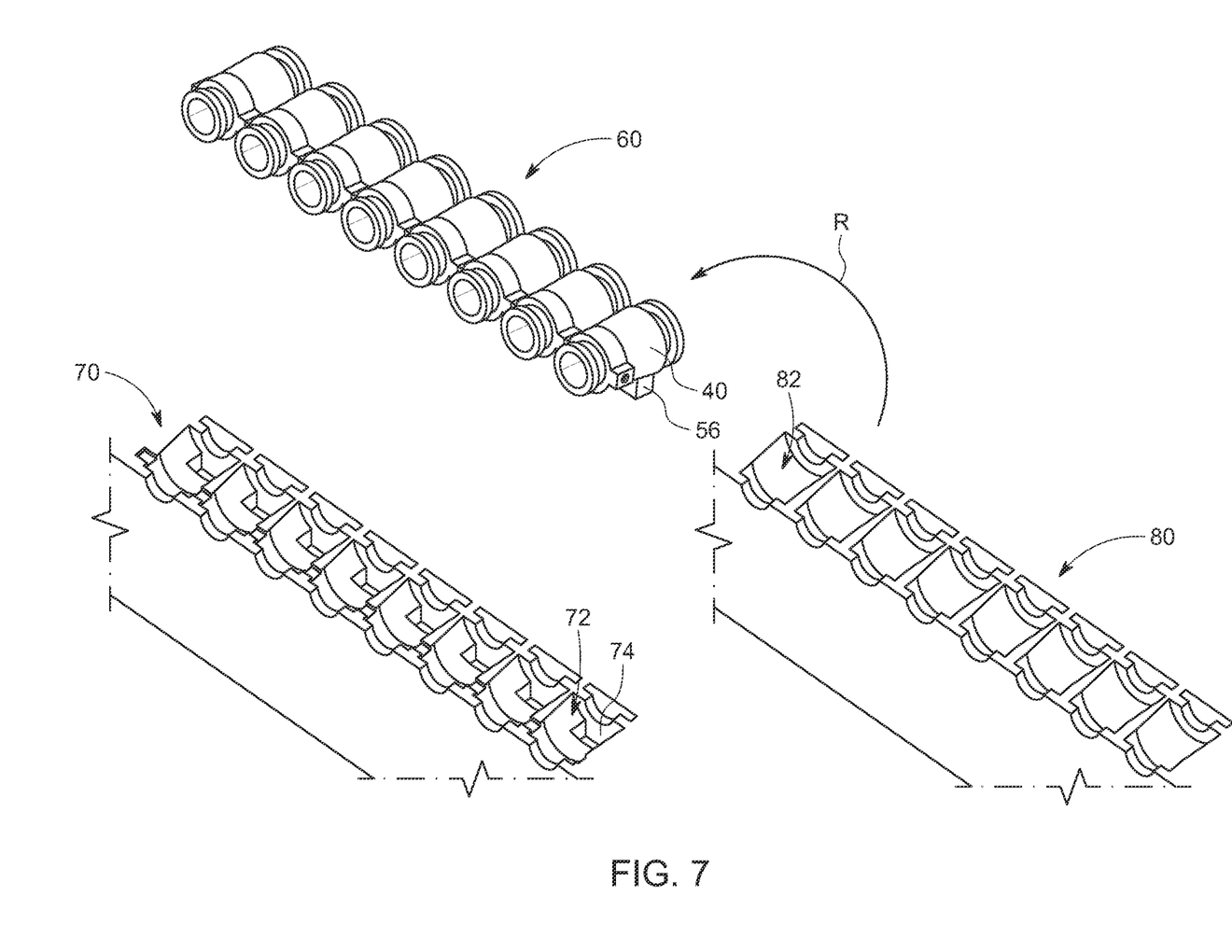
FIG. 7 schematically illustrates the cable-gland system of FIG. 6 fitting within cavities in the base and the cover of an electronics chassis.

With further reference to FIG. 3, the cable gland 40 also includes a registration feature 56 for mating within a corresponding feature in the electronics chassis, as explained relative to FIG. 7. As shown, the registration feature 56 is a protrusion having a rectangular cross-section that extends downwardly from the outer surface 42 of the cable gland 40. Other types and numbers of protrusions (as well as recesses) could also be utilized for the registration feature 56.

Figure 4:
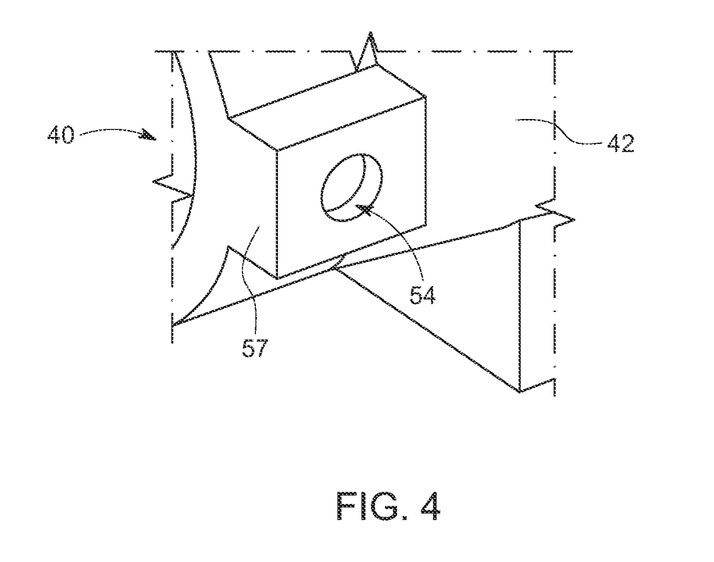
FIG. 4 is a perspective view of the right side of the cable gland of FIG. 3.

As shown in FIG. 4, the female feature 54 is in the form of a recess located on a rectangular platform 57 on the outer surface 42 of the cable gland 40. The recess of the female feature 54 can be various shapes and sizes that correspond to the male feature 52. However, the female feature 54 does not extend into the region of the through-hole 45 (FIG. 3) of the cable gland 40. The rectangular platform 57 includes a flat surface into which the recess of the female feature 54 is formed.

Figure 5:
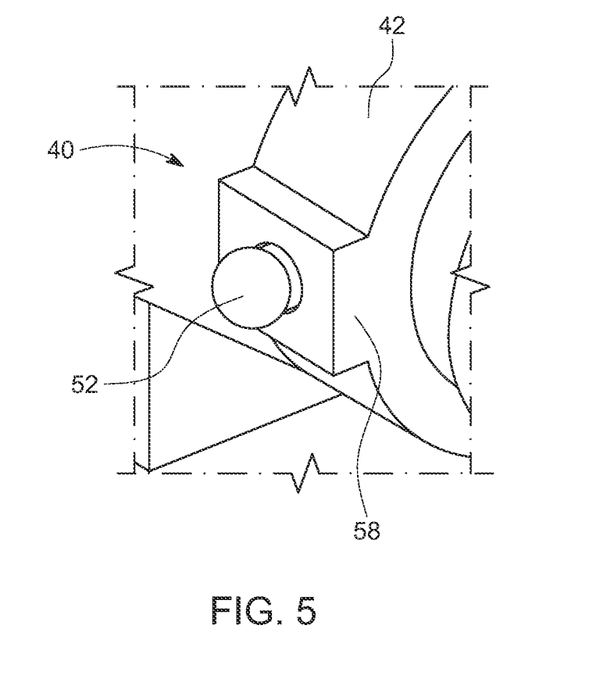
FIG. 5 is a perspective view of the left side of the cable gland of FIG. 3.

FIG. 5 illustrates the male feature 52, which is illustrated as a bulb-like projection. Other shapes and forms for the male feature 52 are contemplated as well. The male feature 52 extends outwardly away from a rectangular platform 58 on the outer surface 42 of the cable gland 40. The rectangular platform 58 includes a flat surface, which contacts the flat surface of the rectangular platform of an adjacent cable gland 40 during the connection process, as described in more detail below relative to FIG. 6.

Figure 6:
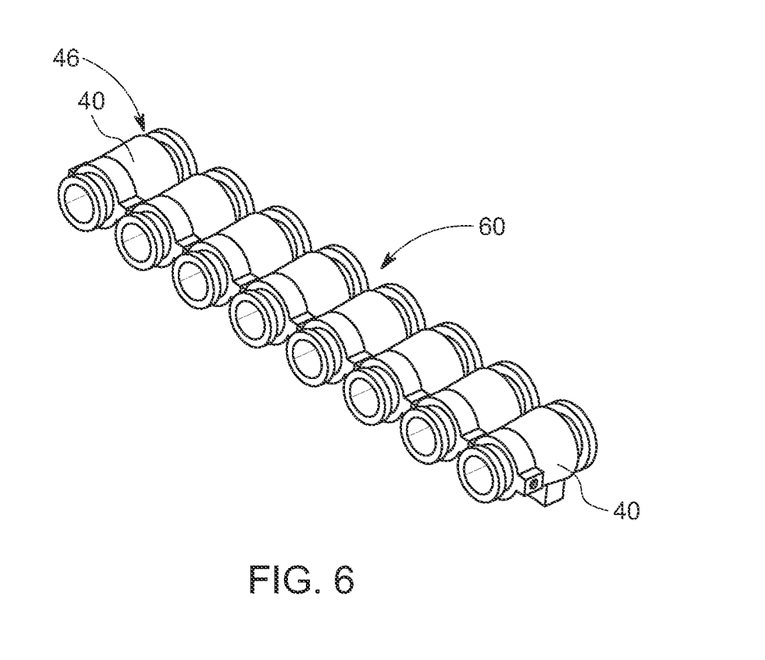
FIG. 6 is a perspective view a modular cable-gland system comprised of a plurality of cable glands, according to another embodiment of the present disclosure.

FIG. 6 illustrates an exemplary embodiment in which eight cable glands 40 are connected together by their corresponding male features 52 (FIG. 5) and female features 54 (FIG. 4) to form a cable-gland system 60. Except for the leftmost cable gland 40 in the cable-gland system 60, the male protrusion feature 52 on each of the other seven cable glands 40 connects into the female recess feature 54 on the adjacent cable gland 40 to the left. The flat surfaces of the platforms 57 (FIG. 4) of the female features 54 engage against the flat surfaces of the platforms 58 (FIG. 5) of the adjacent male features 52. The connection is preferably a snap-fit type connection such that the different cable glands 40 within the cable-gland system 60 can be easily disconnected and rearranged in the cable-gland system 60, as needed. This modularity is important because different cable glands 40 are designed with different internal diameters for the through-hole 45 for receiving different sizes of cables (i.e., cables with different outside diameters). As such, though the different individual cable glands 40 within the cable-gland system 60 have the same outer profile with the same male and female features 52, 54 (FIGS. 4-5), they have different internal dimensions for receiving different cables. Consequently, the different cable glands 40 within the cable-gland system 60 can be moved around and exchanged for other cable glands 40 within the cable-gland system 60 so that different cables at various locations within the device can be accommodated.

FIG. 7 schematically illustrates the cable-gland system 60 with the eight cable glands 40 of FIG. 6 in use with a base 70 and a cover 80 of an electronics chassis (e.g., a 5G electronics chassis). The base 70, the cover 80, and the electronics chassis may be in various forms, such as the general form of the electronic chassis 10 shown in FIG. 1. Though the base 70 of the chassis is shown in its correct orientation in FIG. 7, the cover 80 is shown upside down so that the internal structures at its lower surface can be visualized. The cover 80 would be rotated in the direction of the arrow R to fit onto the cable-gland system 60.

The base 70 includes a plurality of cavities 72 that are sized to match the outer profiles of the cable glands 40 within the cable-gland system 60. Each cavity 72 includes an opening 74 for receiving the corresponding registration feature 56 on the cable gland 40. The opening 74 and the registration feature 56 are both rectangular in shape in this embodiment, but other shapes are also possible. Like the base 70, the cover 80 also includes a plurality of cavities 82 to receive the cable glands 40 of the cable-gland system 60.

Figure 8A:
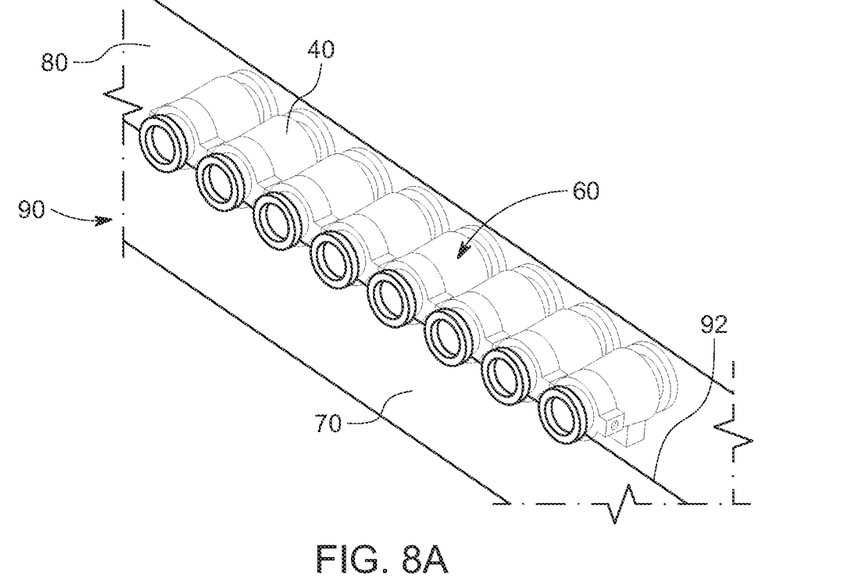
FIG. 8A illustrates the cable-gland system of FIG. 7 within the electronics chassis.

FIG. 8A illustrates the base 70 and the cover 80 when the electronics chassis 90 is in its assembled state. The cable glands 40 of the cable-gland system 60 are located in the electronics chassis 90 at the interface 92 between the base 70 and the cover 80. FIG. 8A illustrates the back portions of the cable glands 40 in lighter lines, because those portions would not normally be seen in this view as they would be contained within the base 70 and the cover 80.

Figure 8B:
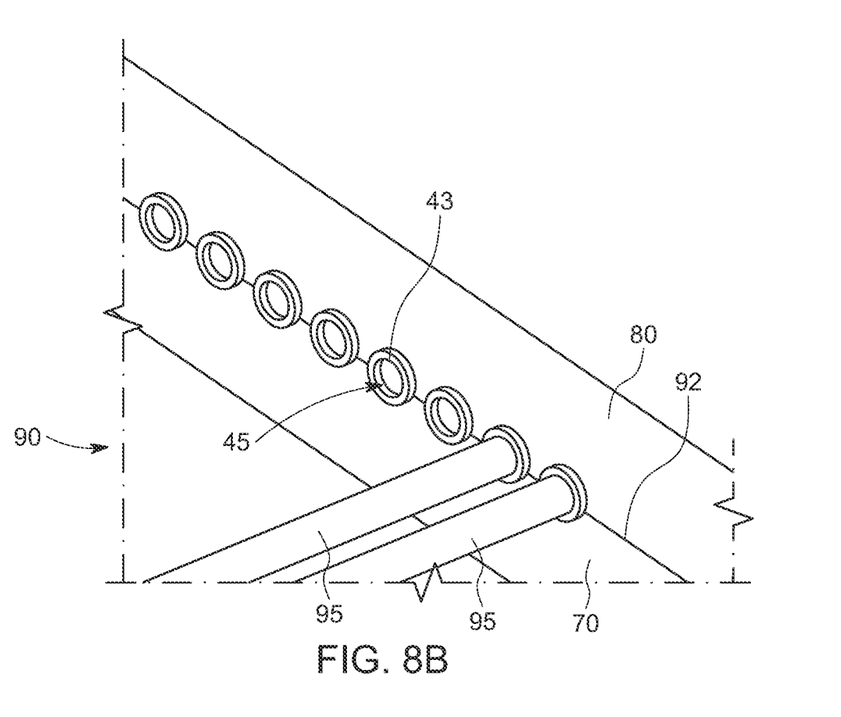
FIG. 8B illustrates cables entering the electronics chassis via the cable-gland system of FIG. 8A.

FIG. 8B illustrates the cable glands 40 of the cable-gland system 60 in a normal setting in which only the exterior ends 43 of each cable gland 40 can be seen at the interface 92 of the base 70 and the cover 80 of the electronics chassis 90. The grooves 48 (FIG. 3) near the exterior ends 43 of each cable gland 40 receive a semicircular cut-out portion of the base 70 and a semicircular cut-out portion of the cover 80, thereby locking the cable glands 40 in place. The registration features 56 and the openings 74 described above relative to FIG. 7, also serve to lock the cable glands 40 in place.

As shown in FIG. 8B, the cable-gland system 60 permits cables 95 to enter and exit the electronics chassis 90 via the through-holes 45 of the cable glands 40. Thus, the cable-gland system 60 is easy to assemble and inhibits entry of water and/or contaminates into the chassis 90. As noted above, each cable gland 40 can be specifically sized on its internal diameter to receive a certain size of cable. Further, some cable glands 40 in the cable-gland system 60 can be "dummies" in that they contain no internal through-hole 45, but are instead solid. For example, in FIG. 8B, the left six cable-glands 40 in the cable-gland system 60 can be "dummies," in that they do not serve the function of permitting a cable to enter the electronics chassis 90. But because the base 70 and cover 80 both contain cavities 72, 82 (FIG. 7), those cavities need to be plugged, which is accomplished by a "dummy" cable gland 40.

As such, the present invention contemplates a kit of cable glands 40 that have the same outer profile, but differently sized inner through-holes 45 or no through-holes at all. As an example, RJ45 cables may have an outside diameter of 5.5 mm; optical fiber cables may have an outside diameter of 9.5 mm; DC power cables may have an outside diameter of 8 mm; and USB cables may have an outside diameter of 5.0 mm. The kit of cable glands 40 (perhaps provided with color-coding or other indicia to indicate the cables to which they apply) may have different sizes to accommodate each of these various cables. Thus, the different cable glands 40 can be attached together, as described above, to accommodate a specific and unique arrangement of different cables for a particular electronics chassis.

Regarding assembly, the present invention contemplates various assembly processes and methodologies to arrange the cable glands 40 with cables and place them into the electronic chassis 90. For example, with further reference to FIG. 8B, the cables 95 would be inserted through the through-holes 45 of a properly sized cable gland 40. The terminal ends of the cables 95 can then be coupled to the corresponding electronic components (not shown in FIG. 8B) in the electronics chassis 90 (assuming the terminal ends of the cable 95 are not already connected to the electronic components). If the cables 95 have free ends outside of the chassis, but their terminal ends are already connected to the electronic components in the electronic chassis 90, then the cable glands 40 can be slid over the free ends. The cable glands 40 can then be fixed together by their complementary male and female features 52, 54 (FIGS. 4-5) to form the cable-gland system 60. The cable-gland system 60 is then inserted at the interface 92 of the electronic chassis 90 such that the registration features 56 fit into the openings 74 of the cavities 72 of the base 70, as shown in FIG. 7. The present disclosure contemplates that the base 70 and the cover 80 can be attached via various fasteners or clips.

Because the cable glands 40 are preferably made from a compressible material that can be restored to its original shape without force (e.g., a compressible rubber), the sealing function can be provided at the exterior of the cable glands 40 that are engaging the base 70 and the cover 80. The interior of the cable glands 40 within the through-holes 45 also provide a tight seal due to the rubber material. Preferably, the cable glands 40 create an interference fit with the base 70 and the cover 80 to assist with the sealing feature when the cover 80 is attached to the base 70. Further, the circumferences of the cables 95 also preferably create an interference fit with the through-holes 45 of the cable glands 40 at the interface 92 for sealing. Further, the O-rings 46 (FIG. 3) of the cable glands 40 provide a sealing function at the inside surface of the electronic chassis 90.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cable-gland system for sealing openings that receive cables in an electronic chassis, the cable-gland system comprising:

a plurality of individual cable glands, each of the plurality of individual cable glands including an exterior end to be positioned adjacent an exterior of the electronic chassis, an interior end for positioning within the electronic chassis, a through-hole extending between the exterior and interior ends for receiving one of the cables, and an outer surface between the exterior and interior ends, each of the plurality of individual cable glands having a male projection on one side of the outer surface and a female recess on an opposing side of the outer surface; and wherein the plurality of individual cable glands is configured to be connected to form the cable-gland system by mating the male projection on one cable gland with the female recess of an adjacent cable gland;

wherein each of the plurality of individual cable glands has a registration feature for mating within a corresponding feature in the electronic chassis, the registration feature being positioned in a central area between the exterior end and the interior end, the male projection and the female recess being positioned between the exterior end and the registration feature.

2. The cable-gland system of claim 1, wherein the registration feature is a projection extending away from the outer surface for mating within a corresponding recess in the electronic chassis.

3. The cable-gland system of claim 1, wherein the through-holes in the individual cable glands have different internal diameters for receiving cables of different sizes.

4. The cable-gland system of claim 1, wherein each of the plurality of individual cable glands includes a front annular groove adjacent to the exterior end, the front annular groove configured to receive a corresponding portion of the electronic chassis.

5. The cable-gland system of claim 4, wherein the exterior ends of the plurality of individual cable glands protrude outside of the electronic chassis.

6. The cable-gland system of claim 1, wherein each of the plurality of individual cables further includes an O-ring adjacent to the interior end for assisting with sealing the cable gland within the electronic chassis.

7. The cable-gland system of claim 1, wherein each of the plurality of individual cable glands is generally cylindrical, the male projection is located on a first platform extending away from the one side of the outer surface, the female recess is located on a second platform extending away from the opposing side of the outer surface.

8. The cable-gland system of claim 1, wherein the male projections of the plurality of individual cable glands and the female recesses of the plurality of individual cable glands form a snap-fit connection.

9. The cable-gland system of claim 1, wherein each of the plurality of individual cable glands is interchangeable within the cable-gland system such that locations of two individual cable glands within the cable-gland system can be exchanged.

* * * * *